United States Patent
Beer et al.

(10) Patent No.: US 7,188,061 B2
(45) Date of Patent: Mar. 6, 2007

(54) SIMULATION MONITORS BASED ON TEMPORAL FORMULAS

(75) Inventors: Ilan Beer, Haifa (IL); Sharon Keidar, Yokneam (IL)

(73) Assignee: International Business Machines Corporation, Armonk, NY (US)

(*) Notice: Subject to any disclaimer, the term of this patent is extended or adjusted under 35 U.S.C. 154(b) by 793 days.

(21) Appl. No.: 10/196,702

(22) Filed: Jul. 15, 2002

(65) Prior Publication Data

US 2003/0018461 A1    Jan. 23, 2003

Related U.S. Application Data

(60) Provisional application No. 60/305,093, filed on Jul. 16, 2001.

(51) Int. Cl.
  *G06F 9/45* (2006.01)
(52) U.S. Cl. .............................. 703/22; 716/5
(58) Field of Classification Search ................ 716/5
  See application file for complete search history.

(56) References Cited

U.S. PATENT DOCUMENTS 6,493,852 B1* 12/2002 Narain et al. ................. 716/5

OTHER PUBLICATIONS

"Generation of design verification tests from behavioral VHDL programs using path enumeration and constraint programming" Vemuri, R.; Kalyanaraman, R.;Very Large Scale Integration (VLSI) Systems, IEEE Transactions on vol. 3, Issue 2, Jun. 1995 Page(s):.*
"Design verification and functional testing of finite state machines" Weiss, M.W.; Seth, S.C.; Mehta, S.K.; Einspahr, K.L.; VLSI Design, 2001, Fourteenth International Conference on Jan. 3-7, 2001 pp. 189-195.*
A.J. Hu, M.Y. Vardi, 'Computer Aided Verification', *Proceedings of the 10th International conference, CAV 1998*), 6 pages.
T. Schlipf, T. Buechner, R. Fritz, M. Helms, J. Koehl, 'Formal verification made easy', *IBM Journal of Research and Development*. vol. 41, No. 4/5, pp. 567-576, Jul./Sep. 1997.
I. Beer, S. Ben-David, C. Eisner, A. Landver, 'RuleBase: an Industry-Oriented Formal Verification Tool', *Proceedings of the Design Automation Conference DAC96*, Las Vegas, Nevada, 1996, 6 pages.
E.M. Clarke, Jr., O. Grumberg, D.A. Peled, 'Model Checking', *The MIT Press, 1999*, 4 pages.
K.L. McMillan (Carnegie Mellon University); 'Symbolic Model Checking,' *Kluwer Academic Publishers, 1993*, 3 pages.

* cited by examiner

*Primary Examiner*—Hugh Jones
*Assistant Examiner*—Saif Alhija
(74) *Attorney, Agent, or Firm*—Stephen C. Kaufman (57) ABSTRACT

A method for design verification includes receiving a software model of a design of a system under evaluation, and providing a property, which is dependent on a specified variable having a predefined range of values. The property applies to all states of the system for any selected value among the values of the variable within the predefined range. The property is processed so as to generate a checker program for detecting a violation of the property. A simulation of the system is then run using the software model together with the checker program.

28 Claims, 3 Drawing Sheets

SIMULATION MONITORS BASED ON TEMPORAL FORMULAS

CROSS-REFERENCE TO RELATED APPLICATION

This application claims the benefit of U.S. Provisional Patent Application No. 60/305,093, filed Jul. 16, 2001, which is incorporated herein by reference.

FIELD OF THE INVENTION

The present invention relates generally to design simulation and verification, and specifically to design verification based on symbolic model checking.

BACKGROUND OF THE INVENTION

Simulation-based testing is the most commonly-used method for verifying integrated circuit hardware designs. A software model of the design is prepared, typically using a hardware description language, such as VHDL or Verilog. Different input test patterns are then applied to the model, and the output of the model is inspected for errors. The test patterns may be generated either deterministically or at random. In either case, however, it is impossible to ascertain when enough tests have been performed to adequately cover the entire state space of the design. Therefore, even after lengthy simulation, it is still possible that a design bug may have gone undetected.

Because of the shortcomings of simulation, methods of formal verification, particularly model checking, have been gaining in popularity as tools for use in designing integrated circuits and other complex systems. Such methods are described generally by Clarke et al. in *Model Checking* (MIT Press, 1999), which is incorporated herein by reference. To perform model checking of the design of a device, a user reads the definition and functional specifications of the device and then, based on this information, writes a set of properties (also known as a specification) that the design is expected to fulfill. The properties are written in a suitable specification language for expressing temporal logic relationships between the inputs and outputs of the device. Such languages are commonly based on Computation Tree Logic (CTL). A hardware model (also known as an implementation) of the design is then tested to ascertain that the model satisfies all of the properties in the set.

After the specification and hardware model have been prepared, the actual model checking is typically carried out automatically using a symbolic model checking program, such as SMV, as described, for example, by McMillan in *Symbolic Model Checking* (Kluwer Academic Publishers, 1993), which is incorporated herein by reference. A number of practical model checking tools are available, among them RuleBase, developed by IBM Corporation. This tool is described by Beer et al. in RuleBase: an Industry-Oriented Formal Verification Tool, in *Proceedings of the Design Automation Conference DAC96* (Las Vegas, Nev., 1996), which is incorporated herein by reference.

Formal verification based on model checking is, in principle, superior to simulation-based testing methods, because model checking covers the entire state space of the target system exhaustively and systematically. Therefore, any violations of the specified properties are certain to be discovered. Existing model checking tools, such as RuleBase, also give the designer a clear exposition of the path through the state space of the model that led to the violation.

Formal verification suffers, however, from the well-known problem of state space explosion. As the modeled system grows larger, the computational resources needed to explore the entire state space grow exponentially. Techniques have been developed for reducing the severity of this problem. Such a technique is described, for example, by Beer et al., in On-the-fly Model Checking of RCTL Formulas, *Proceedings of the Tenth International Conference on Computer Aided Verification* (CAV 1998), which is incorporated here in by reference. Nevertheless, it appears that simulation testing will still remain part of the design verification tool chest for the foreseeable future.

Although formal verification and simulation are essentially different and separate techniques, some attempts have been made to combine elements of both techniques in a single testing environment. For example, Schlipf et al. describe a methodology and tool for combined formal verification and simulation in Formal Verification Made Easy, *IBM Journal of Research and Development* 41:4,5 (1997), which is incorporated herein by reference. A state machine formulation is used to represent the specification of the system being verified. If formal verification is not completed within a preset time period (due to state-space explosion), the verification tool switches automatically to random simulation testing.

SUMMARY OF THE INVENTION

Preferred embodiments of the present invention provide methods for automatic generation of on-line formal checkers from properties expressed as temporal logic formulas, for use in simulation-based verification. Each property is translated into a program in a hardware description language, which is then compiled together with the actual hardware model. The term formal checker, or simply checker, as used herein refers to this program, which may be generated either in a dedicated hardware description language, such as VHDL, or in a generic software language, such as C (depending on the language in which the hardware model is written).

The checker program represents one or more finite state machines that express the property to be checked. During simulation, the checker tracks the status of the simulated design and reaches an error state if the model violates the property. The checker causes the simulator to report the error to the hardware designer, who can then take the appropriate corrective steps. Such on-line checkers thus provide some of the benefits of formal verification in the simulation environment. They facilitate test result analysis and save debugging efforts by directly identifying property violations and their sources.

In some preferred embodiments of the present invention, a formal checking tool automatically generates checkers based on forall properties. A forall property depends on one or more specified variables, including at least one forall variable. The forall property states that a given formula will hold true in all states of the model for any selected values of the forall variables within a given range. Checkers based on forall properties are particularly difficult to implement, since in principle a separate state machine must be generated for each possible combination of values of the forall variables in the range. When the range is large, it becomes practically impossible to produce all these checkers by manual coding. Nave, automated generation of all the possible checkers that are needed will make the resulting simulation model grow to an unwieldy size, which may exceed memory limitations.

Therefore, the forall checker of the present invention tracks the actual values that the forall variables assume in the simulation, and checks the formula only for these values. The checker preferably spawns a state machine for each new combination of actual values of the forall variables that is assigned in the simulation, and subsequently deletes particular state machines when they are no longer needed. Thus, the checker generates and maintains only the number of state machines that it actually needs at any point in the simulation. If the hardware description language being used imposes a limit on memory allocation (as is the case for VHDL, for example), the user may determine in advance the maximum number of state machines to be generated. In this case, the checker will stop spawning new state machines when it reaches the limit.

Although preferred embodiments are described herein with particular reference to forall properties, the principles of the present invention may similarly be applied to on-line checking of properties of other types. Specifically, whenever multiple parallel state machines are called for to perform a given checking task, the present invention can be used to limit the number of states that must be evaluated, thus alleviating the need to use a complete product model in the checker program.

There is therefore provided, in accordance with a preferred embodiment of the present invention, a method for design verification, including:

receiving a software model of a design of a system under evaluation;

providing a property, which is dependent on a specified variable having a predefined range of values, the property applying to all states of the system for any selected value among the values of the variable within the predefined range;

processing the property so as to generate a checker program for detecting a violation of the property; and running a simulation of the system using the software model together with the checker program.

Typically, receiving the software model includes receiving a simulation model of an electronic device, written in a hardware description language, wherein processing the property includes generating checker code in the hardware description language. Preferably, running the simulation includes compiling the checker code together with the simulation model, and running the compiled code in a hardware simulation environment.

Typically, the specified variable is one of a plurality of variables upon which the property depends, such that the property applies to all states of the system for any combination of respective values of the variables within respective ranges of the variables.

Preferably, providing the property includes defining a formula that is expected to hold for all of the states of the system, and running the simulation includes detecting a violation of the property using the checker program. Most preferably, the states' of the system include one or more initial states and one or more error states, in which the property is violated, and detecting the violation includes finding a trace through the states of the system from one of the initial states to one of the error states.

Further preferably, processing the property includes generating a finite state machine representing the property, and running the simulation includes stepping through the states of the state machine. Most preferably, stepping through the states includes generating multiple instances of the state machine, each corresponding to one of the values of the specified variable. Additionally or alternatively, generating the finite state machine includes generating a non-deterministic finite automaton, wherein generating the finite state machine further includes converting the non-deterministic finite automaton to a deterministic form.

Preferably, running the simulation includes creating multiple checker instances, each such instance corresponding to a respective one of the values of the specified variable, and running each of the checker instances to detect the violations of the property. Further preferably, creating the multiple checker instances includes creating each of the instances at a respective point in the simulation at which the respective one of the values is referenced to the specified variable. Most preferably, running each of the instances includes running a first one of the instances, and creating each of the instances includes spawning a second one of the instances from the first one of the instances at the respective point in the simulation at which the respective one of the values for the second one of the instances is referenced to the specified variable in running the first one of the instances. At the respective point in the simulation at which the second one of the instances is spawned, the states of the first one and the second one of the instances are identical, except for assignment of the respective one of the values to the specified variable in the second one of the instances.

Additionally or alternatively, creating the multiple checker instances includes creating a number of the checker instances that is substantially smaller than the number of the values that the specified variable can assume within the predefined range. Preferably, creating the number of the checker instances includes setting a limit on the number of the checker instances to be created, and creating each of the instances when the respective one of the values is referenced to the specified variable during the simulation only if the number of the checker instances running is less than the limit. Further additionally or alternatively, running each of the checker instances includes determining that one of the checker instances has reached a predefined terminal state, and deleting the one of the checker instances that has reached the predefined terminal state.

There is also provided, in accordance with a preferred embodiment of the present invention, a method for design verification, including:

receiving a software model of a design of a system under evaluation;

providing a property that is applicable to the system;

processing the property so as to generate a finite state machine representing the property, the state machine having a plurality of states including an error state that corresponds to a violation of the property;

initiating a simulation of the system using the software model and an initial instance of the state machine;

stepping through the states of the initial instance of the state machine while running the simulation;

spawning one or more further instances of the state machine during the simulation, responsive to the states of the initial instance;

stepping through the states of the one or more further instances of the state machine while running the simulation; and detecting the violation of the property when one of the instances of the state machine reaches the error state.

Preferably, providing the property includes specifying a dependence of the property on a specified variable of the system having multiple possible values, and spawning the one or more further instances includes generating the further instances responsive to assignment of respective new values to the specified variable during the simulation. Further preferably, providing the property includes defining the property so as to apply to all states of the system for any selected value in a predefined range of the possible values that the specified variable can assume. Typically, generating the further instances includes creating a number of the instances that is substantially smaller than the number of the values that the specified variable can assume within the predefined range. Most preferably, creating the number of the instances includes setting a limit on the number of the instances to be created, and creating each of the instances when the respective new values are assigned to the specified variable during the simulation only if the number of the instances running is less than the limit.

Additionally or alternatively, generating the further instances includes initializing the further instances such that the states of the initial and further instances are identical, except for the assignment of the new values to the specified variable in the further instances.

Preferably, stepping through the states of the initial and further instances includes determining that one of the instances has reached a predefined terminal state of the state machine, and deleting the one of the instances that has reached the predefined terminal state.

Additionally or alternatively, stepping through the states of the one or more further instances includes spawning one or more additional instances of the state machine during the simulation, responsive to the states of at least one of the one or more further instances.

There is additionally provided, in accordance with a preferred embodiment of the present invention, apparatus for design verification, including:

a checker generator, which is coupled to receive a property, which is dependent on a specified variable having a predefined range of values, the property applying to all states of a system under evaluation for any selected value among the values of the variable within the predefined range, and which is arranged to process the property so as to generate a checker program for detecting a violation of the property; and a simulator, which is coupled to receive a software model of a design of the system under evaluation and to receive the checker program, and which is arranged to run a simulation of the system using the software model together with the checker program.

There is further provided, in accordance with a preferred embodiment of the present invention, apparatus for design verification, including:

a checker generator, which is coupled to receive a property that is applicable to a system under evaluation and to process the property so as to generate a checker program corresponding to a finite state machine representing the property, the state machine having a plurality of states including an error state that corresponds to a violation of the property; and a simulator, which is coupled to receive a software model of a design of the system under evaluation and to receive the checker program, and which is arranged to initiate a simulation of the system using the software model with an initial instance of the state machine, wherein the checker program causes the simulator to step through the states of the initial instance of the state machine while running the simulation, to spawn one or more further instances of the state machine during, the simulation, responsive to the states of the initial instance, to step through the states of the one or more further instances of the state machine while running the simulation, and to detect the violation of the property when one of the instances of the state machine reaches the error state.

There is moreover provided, in accordance with a preferred embodiment of the present invention, a computer software product, including a computer-readable medium in which program instructions are stored, which instructions, when read by the computer, cause the computer to receive a property, which is dependent on a specified variable having a predefined range of values, the property applying to all states of a system under evaluation for any selected value among the values of the variable within the predefined range, and which is arranged to process the property so as to generate a checker program, to be run by a simulator together with a software model of a design of the system under evaluation in a simulation of the system so as to detect a violation of the property.

There is furthermore provided, in accordance with a preferred embodiment of the present invention, a computer software product, including a computer-readable medium in which program instructions are stored, which instructions, when read by the computer, cause the computer to receive a property that is applicable to a system under evaluation and to process the property so as to generate a checker program to be run by a simulator together with a software model of a design of the system under evaluation in a simulation of the system, the checker program corresponding to a finite state machine representing the property, the state machine having a plurality of states including an error state that corresponds to a violation of the property, wherein the checker program causes the simulator to initiate the simulation of the system using an initial instance of the state machine, to step through the states of the initial instance of the state machine while running the simulation, to spawn one or more further instances of the state machine during the simulation, responsive to the states of the initial instance, to step through the states of the one or more further instances of the state machine while running the simulation, and to detect the violation of the property when one of the instances of the state machine reaches the error state.

The present invention will be more fully understood from the following detailed description of the preferred embodiments thereof, taken together with the drawings in which:

DETAILED DESCRIPTION OF PREFERRED EMBODIMENTS

Figure 1:
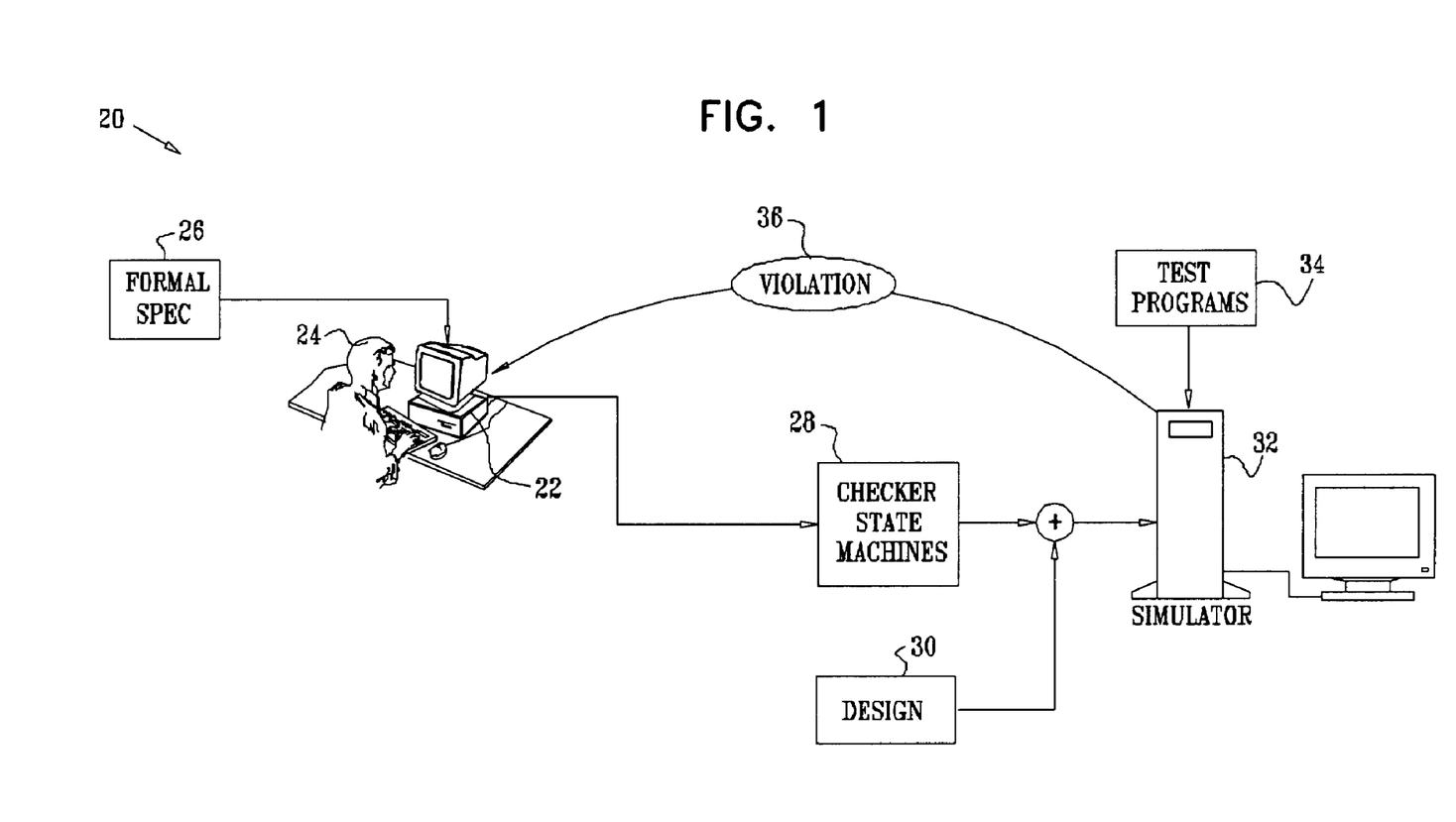
FIG. 1 is a block diagram that schematically illustrates a system for design verification, in accordance with a preferred embodiment of the present invention.

FIG. 1 is a block diagram that schematically illustrates a system 20 for design verification, combining design simulation with formal checking, in accordance with a preferred embodiment of the present invention. A verification engineer 24 inputs a formal specification 26 to a checker generator 22. The checker generator typically comprises a general-purpose computer, which is equipped with software for translating formulas from specification 26 into formal checker programs 28 in a hardware description language. The software used by generator 22 in carrying out such operations may be supplied to the computer on tangible media, such as CD-ROM, or it may alternatively be downloaded to the computer in electronic form, over a network, for example. Typically, although not necessarily, the software is supplied as part of a suite of programs for formal verification.

Formal checkers 28 are linked to a design 30 of a hardware device in development, which is typically written in the same hardware description language as the checkers. The hardware description language may be a dedicated hardware description language, such as VHDL or Verilog, or it may alternatively be a generally-purpose software language, such as C, which is used for modeling the behavior of hardware designs in development. The checkers and design are compiled together and then run on a simulator 32, using methods of simulation known in the art. The simulator exercises design 30 in accordance with test programs 34, which may be generated automatically or written by engineer 24 or other personnel.

During simulation, checkers 28 detect violations of the properties in specification 26 and cause simulator 32 to output indications 36 of violations that have occurred. These indications are provided to engineer 24 and/or to other users. Depending on the information provided about any given violation, the user concerned may decide to fix design 30, change the properties in specification 26, or modify test programs 34. The checkers and design are then recompiled, and simulator 32 is run again until the design is bug-free and no more property violations are encountered.

Typically, engineer 24 writes specification 26 in a suitable temporal logic language. For example, the specification may be written in RCTL, an extension to the conventional CTL language using regular expressions, which is described in the above-mentioned article by Beer et al. The article goes on to describe a technique for translating many CTL formulas conveniently into state machines having an error state. This technique may be used to generate state machines to serve as formal checkers 28. Running such a state machine together with design 30 is equivalent to testing for violations of the CTL formula AG(¬error). (An AG(p) formula states that the property p is true in every reachable state of the model.) More recently, Beer et al. have extended RCTL to include further expressions and syntax, as described in The Temporal Logic Sugar, *Proceedings of the Thirteenth International Conference on Computer Aided Verification* (CAV 2001), which is incorporated here in by reference.

RCTL provides forall constructs, which can be used to express properties that are dependent on a specified variable or variables, and which are required to hold true in all states of the hardware model for any selected values of the variables within given ranges. Forall properties have the syntax:

forall variable: type:
formula{ }

The forall variable can take any of its allowed values as an initial value, and then keeps this value subsequently for the duration of the present verification run. The variable type implies a set of allowed values that the variable can take. The formula (or formulas) in the scope of the forall statement should be true for every possible value of the forall variable. The forall property may also include other variables that are not forall variables.

For example, consider the following forall property:

forall x(0 . . . 31): Boolean:
formula{
  {[*], read & din(0 . . . 31)=x(0 . . . 31)}⇒
  {!write, write & dout(0 . . . 31)=x(0 . . . 31)}
}

The formula states that if during any read operation, the value of the vector that is read in, din (a 32-bit vector), is equal to x (which can take any value between 0 and $2^{32}-1$), then in the next write operation, the vector read out, dout, must be equal to the same value of x. It must hold true for all of the possible values of x. Since the actual values that will be assumed by x during a simulation run are not known in advance, covering all the possibilities would require generating $2^{32}$ state machines, running in parallel. The situation becomes even more extreme when (as is often the case) a forall property depends on a combination of two or more different forall variables. A method for limiting the number of state machines to those actually needed is described below.

Figure 2:
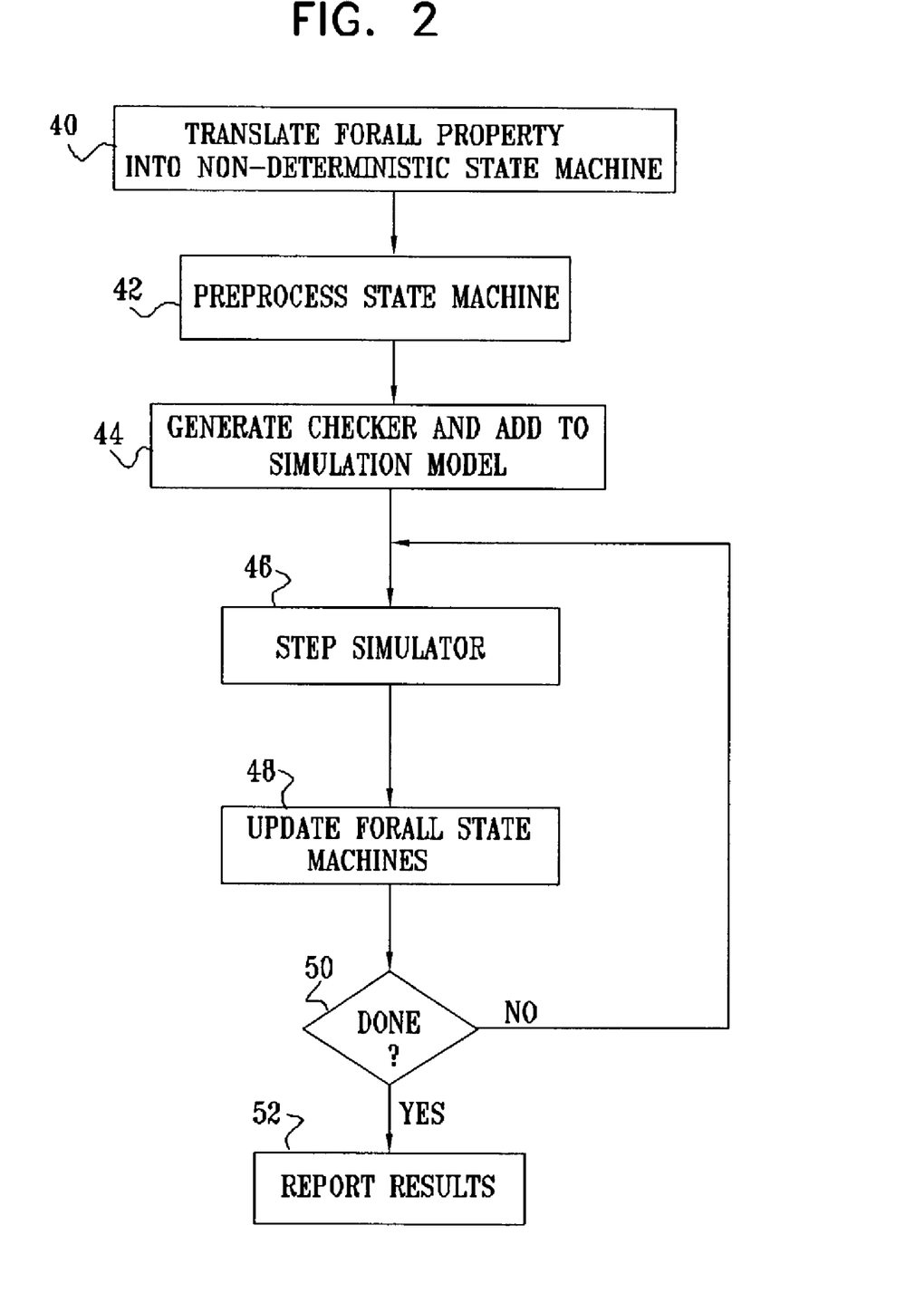
FIG. 2 is a flow chart that schematically illustrates a method for design simulation using a formal checker, in accordance with a preferred embodiment of the present invention.

FIG. 2 is a flow chart that schematically illustrates a method for simulation testing using formal checkers based on a forall property, in accordance with a preferred embodiment of the present invention. To begin with, checker generator 22 translates the property into a non-deterministic state machine, at a translation step 40. The state machine is expresses as a non-deterministic finite automaton (NFA) and an AG(p) formula, wherein p is a Boolean expression. The NFA has a set of error states, in which the property p is false. The NFA is preferably generated automatically using the method described by Beer et al. in the above-mentioned article, On-the-fly Model Checking of RCTL Formulas. Other methods for construction of a NFA based on a temporal logic formula are known in the art.

Formally, the NFA constructed at step 40 has the following elements:
A set S of n states: $s_0, s_1, , s_{n-1}$.
A set $I \subseteq S$ of initial states.
A set $A \subseteq S$ of error states, in which AG(p) is false.
A terminal state term $\in$ S.
Transition conditions T(i,j), $0 \leq i < n$, $0 \leq j < n$.

Each T(i,j) is a Boolean expression referring to a possible transition from state $s_i$ to state $s_j$. Each T(i,j) references one or more identifiers, which may be forall variables. Identifiers that are not forall variables are referred to as port signals. The terminal state is characterized by having only one possible transition, to itself, i.e., if s≠t term, then T(term,s) =false.

There may be m different forall variables referenced by the NFA, $f_0, f_1, f_{m-1}$, each of a declared type.

The NFA constructed at step 40 is said to accept a finite trace $t_0, t_1, t_{u-1}$, through the states in S iff there is a sequence of states $a_0, a_1, a_{u-1}$ in S and a value assignment of all the forall variables such that:
$a_0$ is an initial state of the NFA;
$a_{u-1}$ is an error state of the NFA; and
For each i, $0 \leq i < u$, $T(a_i, a_{i+1})$ is true for the value assignment obtained by combining $t_i$ and the value assignment of the forall variables.

Each state of the NFA combined with the forall variable assignment has the form $(t_i, a_i)$. In running checker 28 in simulator 32, as described hereinbelow, this product model is evaluated in order to find any accepting traces of the NFA, i.e., traces that lead to violation of a specification property.

An integer constant K may also be defined by engineer 24, providing a limit on the number of overlapping transactions that need to be monitored by checker 28. In other words, K is the maximum number of different combinations of values of the forall variables for which the condition p is checked simultaneously. The choice of K depends on memory restrictions imposed by simulator 32.

The NFA generated at step 40 is converted into a form suitable to be used as a checker in simulator 32, in a preprocessing step 42. Typically, simulators do not support non-determinism. Therefore, the NFA is preferably converted at this stage or at the next stage (step 44, described below) into a deterministic finite automaton (DFA), or a set of DFAs. For each possible outcome of each non-deterministic transition in the NFA, checker generator 22 creates a different DFA transition. The number of states of the DFA may be exponential in the number of states of the NFA, but simulation is generally sensitive to the size of the representation (i.e., the number of lines of code used in the hardware description language), rather than the number of states. The number of code lines is at most quadratic in the size of the property in question, i.e., in the number of temporal operators in the formula. Practically speaking, for most common property types, the growth in the code is only linear.

For the purposes of the operation of the checker, it is useful to partition the states of the automaton (whether the NFA or DFA representation is used) with respect to each of the forall variables into latching states and checking states. A latching state is a state in which a value is assigned to the forall variable in question. The automaton should be able to enter a checking state only after having passed through a latching state, and it should not be able to enter any latching state twice. If checker generator 22 is unable partition the states into latching and checking states in this manner, it typically returns an error message and exits. Automatic generation of checker 28 in this case may lead to unreliable results in simulation, and engineer 24 should therefore either modify specification 26 or write the checker code manually.

In order to partition the states into latching and checking states, checker generator 22 detects, for each forall variable $f_i$, all states of the automaton that reference it, i.e., states $S_j$ such that for some k, T(j,k) references $f_i$. Transitions from a latching state that reference $f_i$ are referred to as latching transitions of $f_i$. After partitioning the set of states that reference $f_i$ into latching states and checking states, generator 22 also verifies that the reference to $f_i$ in all these latching states is of the form $f_i=g(x_1, , x_n)$, wherein g is a Boolean expression over a set of port signals $x_1, , x_n$ (not a forall variable). If there is some latching state in which this condition is not fulfilled, generator 22 likewise returns an error message and exits. Here, too, automatic generation of checker 28 may give unreliable results.

As long as the partition into latching and checking states is successful, and the assignments to the forall variables are of the proper form, all references to the forall variables in all latching states (i.e., all expressions of the form $f_i=x$) are replaced simply by the expression true. The latching states are marked to identify the forall variables that should be sampled in each such state.

Having preprocessed the automaton to put it in the desired form, checker generator 22 now converts the automaton into a hardware description language program, at a checker generation step 44. Hardware description languages are generally designed, inter alia, for representing state machines in a clear, simple way. Translation of the automaton into a hardware description language process is therefore straightforward. The property AG(p) of the automaton becomes an Assert(p) statement in VHDL, for example. This statement causes the simulator to print a message when the checker process reaches an error state. The simulator may also be programmed to stop the simulation in such an event. A sample VHDL checker program, based on a simple forall property, is shown in an Appendix below.

In operation, the checker program generates multiple instances of its state machine, as described in detail hereinbelow. The checker keeps track of these instances using a vector L, made up of slots L[0], L[1], L[K−1], wherein K is the constant that was input above at step 40. Each slot is used by the checker to monitor a different state machine instance, corresponding to a different combination of assigned values of the forall variables.

Each slot in L contains the following fields:
1. L[i].active: a Boolean flag specifying whether this slot is currently active.
2. L[i].v: a Boolean vector of n elements, which simulates the behavior of the state machine for the given combination of forall variable values. In each cycle of simulator 32, L[i].v[j] is true iff the state machine could be in state $s_j$ in this cycle. L[i].v thus translates the original NFA into a set of DFAs.
3. For each forall variable $f_j$:
   a. L[i].have_value[j]: a Boolean flag specifying whether this slot has a latched value of $f_j$.
   b. L[i].value[j]: a field used to store the latched value of $f_j$ must be large enough to hold any legal value of $f_j$.

The checker is initialized by marking the first slot, L[0], as active, and all others as inactive. L[0].v holds the initial states of the automaton, i.e., L[0].v[j] is true iff $s_j \in I$. All forall variables are non-latched in L[0], so that L[0].have_value[j] is false for all j. Checker 28 and design model 30 are linked and compiled together, and are then ready to be run by simulator 32.

Simulation now proceeds in the usual fashion, in successive steps of the simulator clock, at a simulation step 46. At each step of the clock, the checker component of the compiled simulation model updates the state of the checker, at an update step 48. Generally speaking, multiple instances of the checker state machine are created, each corresponding to a different combination of values of the forall variables. New state machines are spawned whenever the initial state machine or one of the subsequently-created state machine instances passes a latching transition. (Of course, if there is only a single forall variable, as in the example given above, each instance simply corresponds to a different value that is assigned to this variable. In this case, the state machines spawned by the initial state machine should have no more latching transitions, and only the initial state machine can spawn further new state machines.) Each new state machine instance occupies a different slot of L. Details of this step, including the manner in which the state machine instances are generated, are described below with reference to FIG. 3. The checker program monitors all of the active slots. If any active slot reaches one of the error states $s_i \in A$, the simulator outputs violation indication 36.

Cycling of the simulation clock at step 46 and updating of the checker state machines at step 48 continue until the simulation is finished, at a completion step 50. Typically, the simulation is considered done after a certain number of cycles of the simulation clock have passed, or until certain error conditions are reached. Simulator 32 then reports the simulation results to engineer 24, at a reporting step 52, including any violations of the forall property under test.

Figure 3:
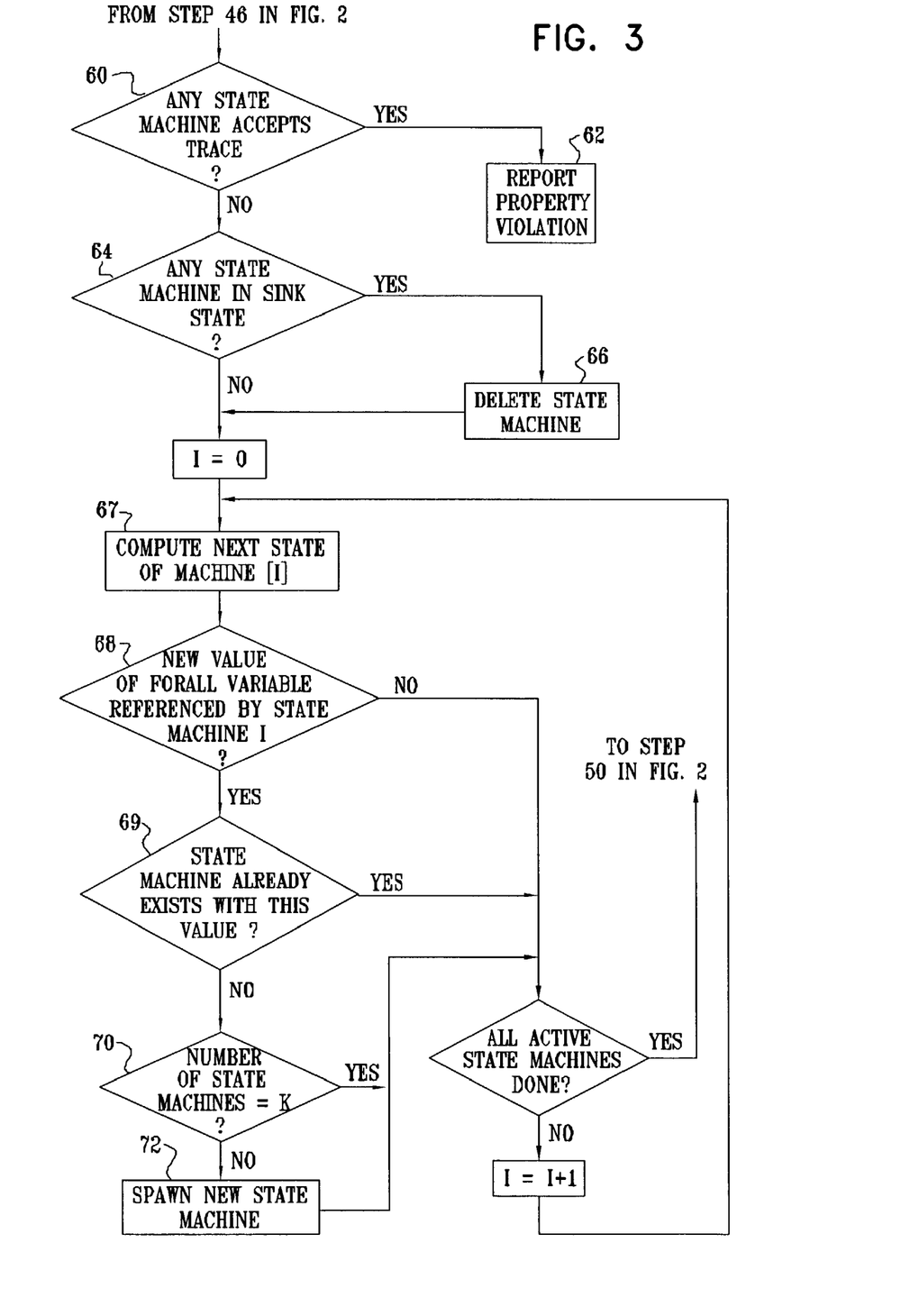
FIG. 3 is a flow chart that schematically illustrates a method for updating finite state machines used in formal checking, in accordance with a preferred embodiment of the present invention.

FIG. 3 is a flow chart that schematically shows details of update step 48, illustrating the operation of checker 28 in simulator 32, in accordance with a preferred embodiment of the present invention. At each cycle of the simulation clock, the checker program reviews all of the active state machines to determine whether any of them have reached one of the error states, at an error checking step 60. In other words, for each active slot L[i], the checker determines whether this slot accepts the trace through the simulation states traversed up to this point. Formally, a slot L[i] will be found to have accepted the trace if for any j, $0 \leq j < n$, L[i].v[j] is true, and $s_j$ is an error state. If the trace is accepted, checker 28 causes simulator 32 to report the violation of the forall property, at a violation reporting step 62. In some cases, as noted above, detection of such an error may trigger termination of the simulation.

Checker 28 next reviews the existing state machine instances to determine whether any of them have reached a terminal state (or sink state), at a sink checking step 64. These state machines have no more useful information to provide with respect to the forall property being checked. Formally, a slot L[i] will be found to have reached the terminal state if L[i].v[term] is true, and L[i].v[j] is false for all j≠term. The continued existence of these dead state machines uses up memory of simulator 32 unnecessarily. Therefore, any state machines found to be in the terminal state term are deleted, at a machine deletion step 66, thus freeing slots of L for state machine instances with new values of the forall variables.

For all remaining active state machines, checker 28 computes the next state transition, at a state computation step 67. Each active state machine may spawn a new state machine instance, if it has reached a latching state of one of the forall variables, at a latching step 68. Before spawning a new instance, however, the checker verifies that there is not a state machine instance already in existence with this assignment of forall variables, at an existence checking step 69. If not, the new instance may be spawned.

To begin with, when the initial state machine (corresponding to L[0]) reaches a latching state, in which a given forall variable $f_j$ is referenced for the first time, a new copy of the state machine is spawned, at a spawning step 72. The new state machine initially has the same state as the parent state machine that spawned it, except that $f_j$ in the new state machine is latched at the referenced value. The new state machine continues to run in parallel with its parent, but whenever the new machine encounters $f_j$ again, it uses the latched value.

Subsequently, the initial state machine and any spawned state machines may continue to spawn further new state machines at subsequent steps of the simulator clock. The new state machines spawned by the initial state machine may latch different values of $f_j$, and may alternatively latch values of other forall variables. The spawned state machine, with the latched value of $f_j$, may spawn a further state machine if it reaches a latching state of another forall variable $f_k$. The spawning of such offspring can continue successively until descendant state machines are spawned in which all the forall variables have latched values.

Table I below is a pseudocode representation of the process of computing state transitions, identifying latching states and spawning new state machines for each existing L[i] in each simulation cycle. The operations represented by the pseudocode correspond to steps 67, 68, 69 and 72 in FIG. 3.

TABLE I

NEXT-STATE COMPUTATION

```
temp: Boolean vector with n elements
set all elements of temp to false
for each j, 0 ≤ j < n:
    if L[i].v[j] is true:
        for each k, 0 ≤ k < n:
            Compute T(j,k) (using latched values of forall
                variables stored in L[i].value[j] if s_j
                is a checking state of one or more of the
                forall variables);
            if T(j,k) evaluated to true, and (j,k) is a
            latching transition for a forall variable f_y,
            attempt to spawn a new state machine instance as
            follows:
                (1) set val to the value of the port
                    signal to which f_y is referenced in
                    T(j,k);
                (2) if an active slot x exists having the
                    same set of latched forall variables
                    as L[i] and having f_y latched to value
                    val, set L[x].v[k] to true;
                (3) if step (2) fails, find a currently-
                    inactive slot x and initialize it as
                    follows:
                    In L[x].v, set L[x].v[k] to true and
                    all other elements of L[x] to false;
                Set L[x].have_value[y] to true;
                    Set L[x].value[y] to val;
                    Set L[x].active to true;
            if T(j,k) evaluated to true, and (j,k) is not a
            latching transition for any forall variable,
                set temp[k] to true.
Set L[i].v to temp.
```

The process of checking for latching states at step 68 and spawning new state machine instances at step 72 continues until all the active slots of L have been checked. If engineer 24 has not specified a value of the parameter K, L may have an essentially unbounded number of slots, and spawning of new state machine instances can continue indefinitely. When simulator 32 is implemented in a language, such as C, that permits dynamic memory allocation, the depth and breadth of the hierarchy of state machines and their spawn is limited only by the available memory of the simulator. If the simulation language is more limiting, as is the case with VHDL, for example, the checker program keeps track of the number of state machine instances that are active. In this case, the checker blocks spawning of new offspring when there are already K instances running, so that all the slots available in L are filled, at a blocking step 70.

Although preferred embodiments are described herein with particular reference to checkers 28 of forall formulas, the principles of the present invention may similarly be applied to on-line checking of formulas of other types. It frequently occurs in simulation checking, even when forall formulas are not used, that multiple state machines must be run in parallel. In methods of checking known in the art, this situation is handled by running a complete product model of all the state machines in question. In such situations, the present invention may be applied so as to limit the number of states that must be evaluated to those actually encountered in the simulation. Furthermore, although the description herein of system 20 refers to verification of a hardware design, the system, as well as the underlying principles of the present invention, may equally be adapted for simulation testing of software and other complex designs.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

APPENDIX

Sample Checker

The list below contains VHDL code corresponding to the forall property:

```
forall data(0 . . 31): boolean;
    formula {ag(write & data_in(0 . . 31)=data, !write[*],
        read(data_out(0 . . 31)=data)}
library ieee;
use iii.std_logic_1164.all;
entity check is
    port}
        clock : std_logic;
        reset : std_logic;
        write : std_logic;
        read : std_logic;
        data_in : std_logic_vector(0 to 31);
        data_out : std_logic_vector(0 to 31);
    )
end checker;
architecture checker of checker is
    type slot_type is record
        is_active : std_logic;
        data_latched : std_logic;
        data_value : std_logic_vector(0 to 31);
        v : std_logic_vector(0 to 4);
    end record;
    constant K : integer := 10;
    type slot_vector is array(0 to K-1) of slot_type;
begin
    p:
    process
        variable slot : slot_vector
        variable temp : std_logic_vector(0 to 4);
        variable fail : std_logic;
        variable i_arg : integer;
        variable data_value_arg : std_logic_vector(0 to 31);
        procedure spawn(
            variable i : integer;
            variable data_value : std_logic_vector(0 to 31)) is
            variable target : integer;
        begin
            target := -1;
            for j in 0 to K-1 loop
                if slot (j).is_active = '0' then
                    slot(j).is_active := '1';
                    slot(j).data_latched := '1';
                    slot(j).data_value := data_value;
                    slot(j).v := "00000";
                    target := j;
                    exit;
                elsif (slot(j).data_latched = '1') and
                    (slot(j).data_value = data_value) then
                    target := j;
                    exit;
                end if;
            if target = -1 then
                assert false report "ran out of slots"
                    severiety note;
                return;
            end if;
            slot(target).v(3) := '1';
            slot(target).v(4) := '1';
        end;
    begin
        wait until clock'event and clock = '1';
        if reset = '1' then
            slot(0).is_active := '1';
            slot(0).data_latched := '0';
            slot(0).data_value := (others => '0');
            slot(0).v := "11100";
            for i in 1 to K-1 loop
                slot(i).is_active := '0';
                slot(i).data_latched := '0';
                slot(i).data_value := (others => '0');
                slot(i).v := "00000";
            end loop;
        else
            for i in 0 to K-1 loop
                if slot(i).is_active = '1' then
                check for property violation
                    fail := (slot(i).v(4) = '1') and
                        (read = '1') and
                        data_out(0 to 31) /=
                            slot(i).data_value);
                    assert not fail report "property failed" severity error;
                vacate dead slots
                    if slot(i).v = "00000" then
                        slot(i).is_active := '0';
                    end if;
                perform state transitions
                    temp := "00000";
                    if slot(i).v(1) = '1] then
                        temp(2) := '1';
                        temp(1) := '1';
                    end if;
                    if (slot(i).v(2) = '1']) and
                        (write = '1]) and
                        (true) then
                            find a vacant slot, latch data_in and spawn a
                            new state machine
                            i_arg := i;
                            data_value_arg := data_in(0 to 31);
                            spawn(i_arg, data_value_arg);
                    end if;
                    if (slot(i).v(3) = '1]) and
                        (not (write = '1])) then
                        temp(4) := '1];
                        temp(3) := '1];
                    end if
                    slot(i).v := temp
                end if:
            end loop;
        end if;
    end process;
end checker;
```

The invention claimed is:

1. A method for design verification, comprising:
receiving a software model of a design of a system under evaluation;
providing a property, which is dependent on a specified variable having a predefined range of values, the property applying to all states of the system for any selected value among the values of the variable within the predefined range;

processing the property so as to generate multiple instances of a checker program for detecting a violation of the property, each such instance corresponding to a respective one of the values of the specified variable;

running a simulation of the system using the software model together with the multiple instances of the checker program so as to detect the violation of the property; and deleting one or more of the multiple instances of the checker program when they are no longer needed during the simulation.

2. A method according to claim 1, wherein receiving the software model comprises receiving a simulation model of an electronic device, written in a hardware description language.

3. A method according to claim 2, wherein processing the property comprises generating checker code in the hardware description language.

4. A method according to claim 3, wherein running the simulation comprises compiling the checker code together with the simulation model, and running the compiled code in a hardware simulation environment.

5. A method according to claim 1, wherein the specified variable is one of a plurality of variables upon which the property depends, such that the property applies to all states of the system for any combination of respective values of the variables within respective ranges of the variables.

6. A method according to claim 1, wherein providing the property comprises defining a formula that is expected to hold for all of the states of the system, and wherein running the simulation comprises detecting a violation of the property using the checker program.

7. A method according to claim 6, wherein the states of the system comprise one or more initial states and one or more error states, in which the property is violated, and wherein detecting the violation comprises finding a trace through the states of the system from one of the initial states to one of the error states.

8. A method according to claim 1, wherein processing the property comprises generating a finite state machine representing the property, and wherein running the simulation comprises stepping through the states of the state machine.

9. A method according to claim 8, wherein stepping through the states comprises generating multiple instances of the state machine, each corresponding to one of the values of the specified variable.

10. A method according to claim 8, wherein generating the finite state machine comprises generating a non-deterministic finite automaton.

11. A method according to claim 1, wherein creating the multiple checker instances comprises creating each of the instances at a respective point in the simulation at which the respective one of the values is referenced to the specified variable.

12. A method for design verification, comprising:
receiving a software model of a design of a system under evaluation;
providing a property that is applicable to the system;
processing the property so as to generate a finite state machine representing the property, the state machine having a plurality of states including an error state that corresponds to a violation of the property;
initiating a simulation of the system using the software model and an initial instance of the state machine;
stepping through the states of the initial instance of the state machine while running the simulation;
spawning one or more further instances of the state machine during the simulation, responsive to the states of the initial instance;
stepping through the states of the one or more further instances of the state machine while running the simulation;
detecting the violation of the property when one of the instances of the state machine reaches the error state; and
deleting one or more of the initial and further instances bf the state machine when they are no longer needed during the simulation.

13. A method according to claim 12, wherein providing the property comprises specifying a dependence of the property on a specified variable of the system having multiple possible values, and wherein spawning the one or more further instances comprises generating the further instances responsive to assignment of respective new values to the specified variable during the simulation.

14. A method according to claim 12, wherein stepping through the states of the initial and further instances comprises determining that one of the instances has reached a predefined terminal state of the state machine, and deleting the one of the instances that has reached the predefined terminal state.

15. A method according to claim 12, wherein stepping through the states of the one or more further instances comprises spawning one or more additional instances of the state machine during the simulation, responsive to the states of at least one of the one or more further instances.

16. Apparatus for design verification, comprising:
a checker generator, which is coupled to receive a property, which is dependent on a specified variable having a predefined range of values, the property applying to all states of a system under evaluation for any selected value among the values of the variable within the predefined range, and which is arranged to process the property so as to generate a checker program for detecting a violation of the property; and
a simulator, which is coupled to receive a software model of a design of the system under evaluation and to receive the checker program, and which is arranged to run a simulation of the system using the software model together with the checker program, which causes the simulator to create multiple checker instances, each such instance corresponding to a respective one of the values of the specified variable, and to run each of the checker instances to detect the violation of the property, wherein the checker program causes the simulator to delete one or more of the multiple checker instances when they are no longer needed during the simulation.

17. Apparatus according to claim 16, wherein the software model comprises a simulation model of an electronic device, written in a hardware description language.

18. Apparatus according to claim 17, wherein the checker generator is arranged to generate the checker program in the hardware description language.

19. Apparatus according to claim 16, wherein the specified variable is one of a plurality of variables upon which the property depends, such that the property applies to all states of the system for any combination of respective values of the variables within respective ranges of the variables.

20. Apparatus according to claim 16, wherein the property comprises a formula that is expected to hold for all of the states of the system, and wherein the checker program causes the simulator to detect a violation of the property using the checker program.

21. Apparatus according to claim 20, wherein the states of the system comprise one or more initial states and one or more error states, in which the property is violated, and wherein the checker program causes the simulator to find a trace through the states of the system from one of the initial states to one of the error states.

22. Apparatus according to claim 16, wherein the checker generator is arranged to generate, as part of the checker program, a finite state machine representing the property, and wherein the checker program causes the simulator to step through the states of the state machine while running the simulation.

23. Apparatus according to claim 22, wherein the checker program causes the simulator to generate multiple instances of the state machine, each corresponding to one of the values of the specified variable.

24. Apparatus according to claim 16, wherein the checker program causes the simulator to create each of the multiple checker instances at a respective point in the simulation at which the respective one of the values is referenced to the specified variable.

25. Apparatus according to claim 16, wherein the checker program causes the simulator to create a number of the checker instances that is substantially smaller than the number of the values that the specified variable can assume within the predefined range.

26. Apparatus for design verification, comprising:
a checker generator, which is coupled to receive a property that is applicable to a system under evaluation and to process the property so as to generate a checker program corresponding to a finite state machine representing the property, the state machine having a plurality of states including an error state that corresponds to a violation of the property; and
a simulator, which is coupled to receive a software model of a design of the system under evaluation and to receive the checker program, and which is arranged to initiate a simulation of the system using the software model with an initial instance of the state machine,
wherein the checker program causes the simulator to step through the states of the initial instance of the state machine while running the simulation, to spawn one or more further instances of the state machine during the simulation, responsive to the states of the initial instance, to step through the states of the one or more further instances of the state machine while running the simulation, and to detect the violation of the property when one of the instances of the state machine reaches the error state, and
wherein the checker program causes the simulator to delete one or more of the initial and further instances of the state machine when they are no longer needed during the simulation.

27. A computer software product, comprising a computer-readable medium in which program instructions are stored, which instructions, when read by the computer, cause the computer to receive a property, which is dependent on a specified variable having a predefined range of values, the property applying to all states of a system under evaluation for any selected value among the values of the variable within the predefined range, and which is arranged to process the property so as to generate a checker program, to be run by a simulator together with a software model of a design of the system under evaluation in a simulation of the system so as to detect a violation of the property, wherein the checker program causes the simulator to create and run multiple checker instances, each such instance corresponding to a respective one of the values of the specified variable,
wherein the checker program causes the simulator to delete one or more of the multiple checker instances when they are no longer needed during the simulation.

28. A computer software product, comprising a computer-readable medium in which program instructions are stored, which instructions, when read by the computer, cause the computer to receive a property that is applicable to a system under evaluation and to process the property so as to generate a checker program to be run by a simulator together with a software model of a design of the system under evaluation in a simulation of the system, the checker program corresponding to a finite state machine representing the property, the state machine having a plurality of states including an error state that corresponds to a violation of the property,
wherein the checker program causes the simulator to initiate the simulation of the system using an initial instance of the state machine, to step through the states of the initial instance of the state machine while running the simulation, to spawn one or more further instances of the state machine during the simulation, responsive to the states of the initial instance, to step through the states of the one or more further instances of the state machine while running the simulation, and to detect the violation of the property when one of the instances of the state machine reaches the error state, and
wherein the checker program causes the simulator to delete one or more of the initial and further instances of the state machine when they are no longer needed during the simulation.

* * * * *